United States Patent [19]

Masuoka

[11] Patent Number: 4,460,835
[45] Date of Patent: Jul. 17, 1984

[54] SEMICONDUCTOR INTEGRATED CIRCUIT DEVICE WITH LOW POWER CONSUMPTION IN A STANDBY MODE USING AN ON-CHIP SUBSTRATE BIAS GENERATOR

[75] Inventor: Fujio Masuoka, Yokohama, Japan

[73] Assignee: Tokyo Shibaura Denki Kabushiki Kaisha, Japan

[21] Appl. No.: 260,994

[22] Filed: May 6, 1981

[30] Foreign Application Priority Data

May 13, 1980 [JP] Japan .................................. 55-63061
May 13, 1980 [JP] Japan .................................. 55-63062
May 13, 1980 [JP] Japan .................................. 55-63063
Oct. 15, 1980 [JP] Japan ................................ 55-143931
Oct. 15, 1980 [JP] Japan ................................ 55-143932

[51] Int. Cl.³ ...................... H03L 5/00; H03K 17/693
[52] U.S. Cl. ................................ 307/296 R; 307/291; 307/577; 307/304
[58] Field of Search ............... 307/296 A, 296 R, 278, 307/291, 448, 450, 465, 572, 577, 581, 304; 357/23 D, 23 R, 89

[56] References Cited

U.S. PATENT DOCUMENTS 3,660,827  5/1972  Tickle ............................ 307/279 X
4,092,548  5/1978  Beilstein, Jr. et al. ............. 307/450
4,096,584  6/1978  Owen et al. ..................... 307/264 X
4,103,189  7/1978  Perlegos et al. .................... 307/270
4,296,340  10/1981 Horan ............................ 307/279 X

FOREIGN PATENT DOCUMENTS 2928430  1/1980  Fed. Rep. of Germany .
3030651  3/1981  Fed. Rep. of Germany .

OTHER PUBLICATIONS

De La Moneda et al., "Paralleling IGFET Loads for Improved Current Driving", *IBM Tech. Disc. Bull.,* vol. 22, No. 1, 6-79, pp. 220-222.
IEEE Transactions on Nuclear Science, No. 6, Dec. 1979, E. E. King, "Radiation-Hardening Status NMOS RAMS", pp. 5060-5064.
Electronics, vol. 50, No. 16, Aug. 4, 1977, R. Pashley et al. "Speedy RAM Runs Cool With Power-Down Circuitry" pp. 103 to 107.
Patent Abstracts of Japan, vol. 2, No. 153, Dec. 22, 1978, Kokai No. 53-121562 issued to Masouka.
Patent Abstracts of Japan, vol. 2, No. 153, Dec. 22, 1978, p. 9854E78, Kokai No. 53-121561 issued to Tarui.

*Primary Examiner*—Larry N. Anagnos
*Assistant Examiner*—David R. Hudspeth
*Attorney, Agent, or Firm*—Finnegan, Henderson, Farabow, Garrett and Dunner

[57] ABSTRACT

A mode switching transistor which is controlled by a chip enable signal is connected between a power supply terminal and a MOS inverter including transistors. The transistor functions as a weak depletion or depletion type MOS transistor to provide sufficient current with a first back gate bias given in an active mode and functions as a perfect enhancement type transistor to completely cut off current with a second back gate bias given in a standby mode.

14 Claims, 10 Drawing Figures

PRIOR ART

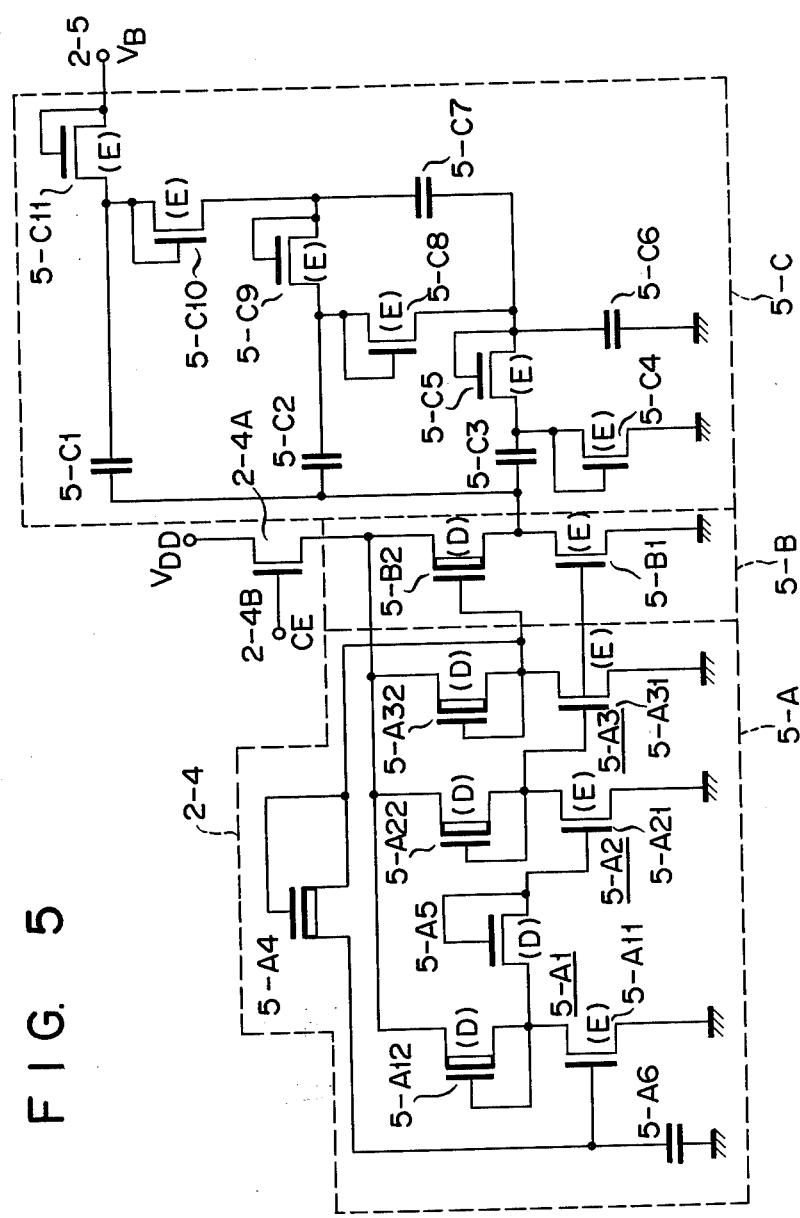
F I G. 5

PRIOR ART

SEMICONDUCTOR INTEGRATED CIRCUIT DEVICE WITH LOW POWER CONSUMPTION IN A STANDBY MODE USING AN ON-CHIP SUBSTRATE BIAS GENERATOR

This invention relates to semiconductor integrated circuit devices having a logic circuit formed by MOS transistors operable both in active and standby modes.

Logic circuits, for instance an inverter, have been formed by MOS transistors operable both in active and standby modes. Such a MOS inverter, however, consumes high electric power compared to the CMOS inverter. Accordingly, various attempts have hitherto been made for reducing the electric power consumption. For example, the U.S. Pat. No. 4,096,584 discloses a method of reducing electric power consumption by an N-channel enhancement/depletion (E/D) type inverter in the standby mode as shown in FIG. 1. This E/D type inverter comprises an E-type driver transistor T1, a D-type load transistor T2 and weak depletion (I) type transistor T3 for saving electric power, these transistors being connected in series between a power supply terminal $V_{DD}$ and ground. A chip enable signal $\overline{CE}$ is impressed upon a control terminal 1-1 connected to the gate of the transistor T3, and an input signal is supplied to an input terminal 1-2 connected to the gate of the transistor T1. The gate of the transistor T2 is connected to the non-grounded terminal of the transistor T1, and an output terminal 1-3 is connected to this juncture. The threshold voltage of the transistor T3 is substantially zero volt. Therefore, when the chip enable signal $\overline{CE}$ is changed to a high level, for instance 5 volts, as the active mode is brought about this source voltage $V_{DD}$ of 5 volts directly appears at a node 1-4 as if the transistor T3 were not present. On the other hand, when the standby mode is brought about, the chip enable signal $\overline{CE}$ goes to a low level, for instance 0 volt, to cut off current through the transistor T3. As a result, the power supply $V_{DD}$ is separated from the inverter transistors T1 and T2, and electric power consumption is consequently reduced. However, since the transistor T3 is of the I-type, in the standby mode the current through the transistor T3 is not completely cut off but slightly flows even when the voltage at the control terminal 1-1 becomes zero volt. Where a static memory device is constructed using a number of such MOS inverters, the total current flowing through a number of transistors T3 in these inverters in the standby mode is comparatively large, and the electric power consumption is noticeably higher than the case of a CMOS memory.

An object of the invention is to provide a semiconductor integrated circuit device, which operates at high speed and consumes low electric power in the active mode and also shows a low power consumption characteristic even in the standby mode.

According to the invention, the above object is achieved by constructing the semiconductor integrated circuit device which comprises a semiconductor logic circuit operable both in the active and standby modes, and an on-chip substrate bias self-sub-bias generating means for providing a first self-sub-bias voltage to the logic circuit in the active mode and providing a second self-sub-bias voltage of a different value in the standby mode.

This invention can be more fully understood from the following detailed description when taken in conjunction with the accompanying drawings, in which:

FIG. 5 is a circuit diagram showing the detailed construction of the other self-sub-bias generator operating in the standby mode shown in FIG. 2;

Figure 1:
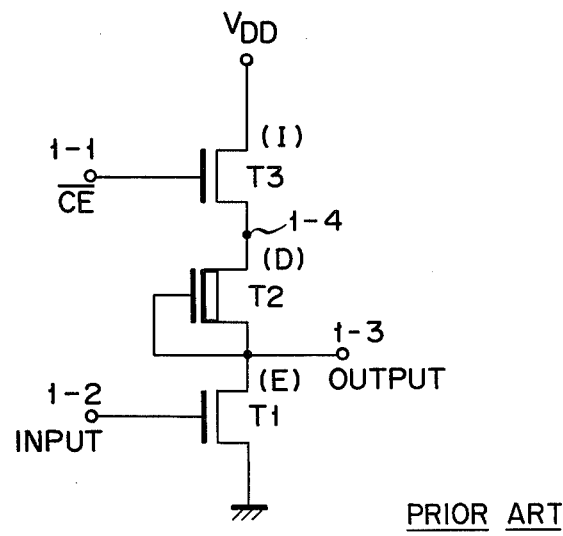
FIG. 1 is a circuit diagram showing a prior art MOS inverter.
Figure 2:
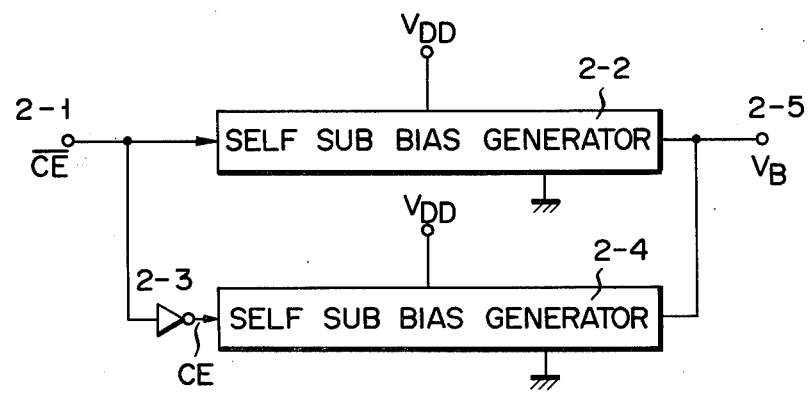
FIG. 2 is a block diagram showing a self-sub-bias generator used for one embodiment of the semiconductor integrated circuit device according to the invention.

Referring to FIG. 2, the chip enable signal $\overline{CE}$ is supplied to an input terminal 2-1. The input terminal 2-1 is connected to a first self-sub-bias generator 2-2 and also connected through an inverter 2-3 to a second self-sub-bias generator 2-4. The first and second self-sub-bias generators 2-2 and 2-4 are each connected between a power supply terminal $V_{DD}$ and ground. The output terminals of the first and second self-sub-bias generators 2-2 and 2-4 are commonly connected to an output terminal 2-5, from which the back bias voltage $V_B$ appears.

Figure 3:
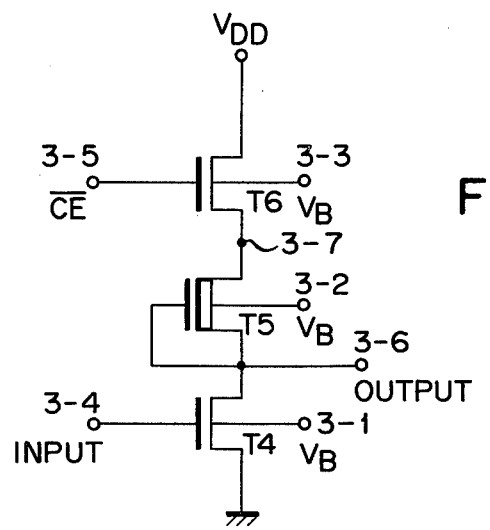
FIG. 3 is a circuit diagram showing a MOS inverter for use in combination with the self-sub-bias generator shown in FIG. 2.

The back bias voltage $V_B$ obtained from the bias generator unit having the basic construction shown in FIG. 2 may be supplied to a MOS inverter circuit having a construction as shown in FIG. 3. This inverter comprises three transistors T4, T5 and T6 connected in series between the power supply terminal $V_{DD}$ and ground. The transistors T4 and T5 are respectively E-type and D-type. The transistors T6 is I- or D-type in the active mode and E-type in the standby mode as will be described in detail later. The transistors T4 to T6 have respective back bias terminals 3-1 to 3-3, to which the self-sub-bias voltage or back bias voltage $V_B$ is commonly applied from the bias voltage output terminal 2-5 shown in FIG. 2. The gate of the transistor T4 is connected to an input terminal 3-4, and the gate of the transistor T6 is connected to a control signal input or a chip enable signal $\overline{CE}$ input terminal 3-5. The gate of the transistor T5 is connected to the juncture between the transistors T4 and T5, and an output terminal 3-6 is connected to the juncture.

When the chip enable signal $\overline{CE}$ supplied to the input terminal 2-1 shown in FIG. 2 is at a high level, for instance of 5 volts, indicative of the active mode, only the self-sub-bias generator 2-2 is rendered operative, and a bias voltage $V_B$ of substantially $-2.5$ volts appears from the output terminal 2-5. The bias voltage $V_B$ has a high charge pump capacity, and the oscillation frequency is set to as high as, for instance, 10 MHz. The bias voltage $V_B$ of $-2.5$ volts obtained in this way is applied to the inverter terminals 3-1, 3-2 and 3-3 shown in FIG. 3. Since at this time 5 volts are applied as the chip enable signal $\overline{CE}$ from the terminal 3-5 to the gate of the transistor T6, the transistor T6 operates as I- or D-type, and sufficient current can be caused through the transistor T6. Also at this time the internal resistance of the transistor T6 is substantially zero, so that the voltage drop due to this current is practically ignorable, and the power supply voltage of $V_{DD}=5$ volts directly appears at the node 3-7. In this state, if an input signal of "0" is coupled to the input terminal 3-4, the transistor T4 remains "off", and the power supply voltage $V_{DD}$ appears as output "1" at the output terminal 3-6. If the input signal is "1", the transistor T4 is turned on, so that the potential at the output terminal 3-6 is rendered substantially to the ground potential of "0".

When the chip enable signal $\overline{CE}$ supplied to the terminal 2-1 in FIG. 2 changes from the level "1" (5 volts) indicative of the active mode to the level "0" (zero volt) indicative of the standby mode, a signal "0" is supplied to the self-sub-bias generator 2-2 to render the generator 2-2 inoperative, while it is supplied as "1" output from the inverter 2-3 to the self-sub-bias generator 2-4 to render the generator 2-4 operative. As a result, the bias voltage $V_B$ supplied from the generator 2-4 to the output terminal 2-5 becomes lower than $-5$ volts, for instance $-6$ volts. Since this bias voltage $V_B$ of $-6$ volts is applied to the bias input terminal 3-3 of the transistor T6 shown in FIG. 3 and also the chip enable signal $\overline{CE}$ applied to the gate of this transistor T6 from the terminal 3-5 is zero volt, the transistor T6 operates as an E-type and is completely cut off. Thus, it is to be appreciated that in this embodiment substantially no current flows between the power supply terminal $V_{DD}$ and ground at the time of the standby mode, so that it is possible to extremely reduce electric power consumption in the inverter.

In addition, since the charge pump capacity of the bias voltage provided from the self-sub-bias generator 2-4 may be reduced in the standby mode, the oscillator frequency in this mode may be 1/10 to 1/100 of the oscillator frequency at the time of the active mode. Thus, the power consumption in the generator 2-4 may also be reduced to 1/10 to 1/100 of the power consumption in the generator 2-2.

Figure 4:
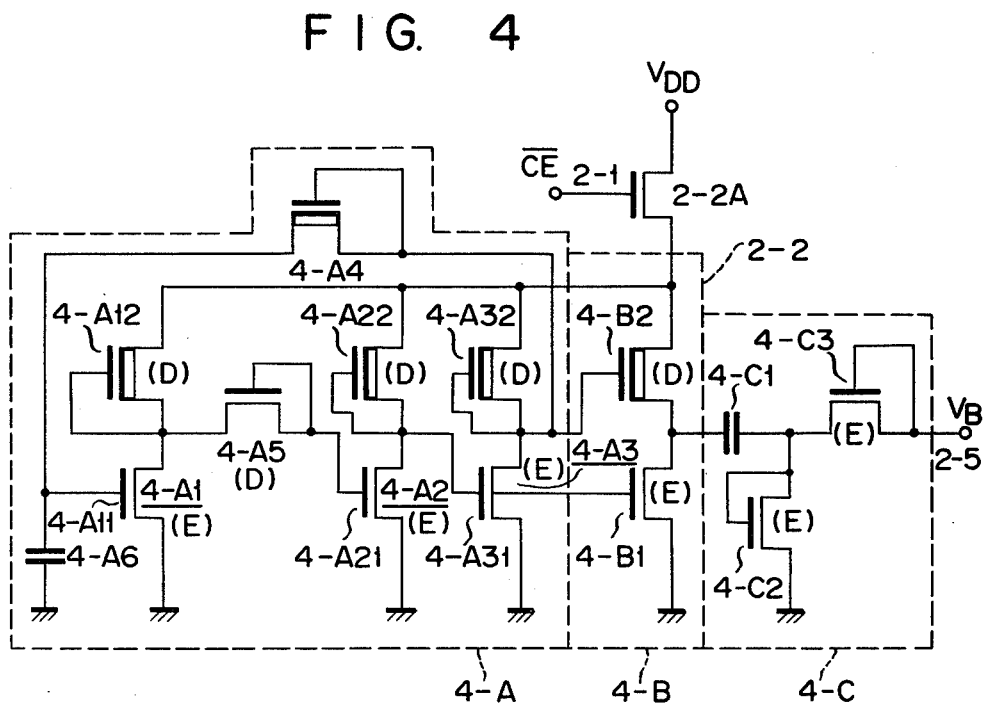
FIG. 4 is a circuit diagram showing the detailed construction of one of the self-sub-bias generators operating in the active mode shown in FIG. 2.

The detailed construction and operation of the self-sub-bias generators 2-2 and 2-4 will now be described with reference to FIGS. 4 and 5. FIG. 4 shows an example of the self-sub-bias generator 2-2 which is rendered operative for the active mode. In FIGS. 2 and 4 like parts are designated by like reference numerals. The self-sub-bias generator 2-2 includes an oscillator 4-A, an amplifier 4-B and an ordinary charge pump circuit 4-C.

The oscillator 4-A has three E/D circuits 4-A1, 4-A2 and 4-A3, and the output of the last stage E/D circuit 4-A3 is fed back through a D-type transistor 4-A4 to the input terminal of the first stage E/D circuit 4-A1. The first stage E/D circuit 4-A1 is constituted by a series combination of an E-type transistor 4-A11 and D-type transistor 4-A12, with one end of the transistor 4-A11 being grounded and one end of the transistor 4-A12 being connected through a transistor 2-2A to the power supply terminal $V_{DD}$. The gate of the transistor 2-2A is connected to a gate terminal 2-1, to which the chip enable signal $\overline{CE}$ shown in FIG. 2 is supplied via the gate terminal 2-1. The output of the first stage E/D circuit 4-A1, derived from the juncture between the transistors 4-A11 and 4-A12, is coupled through a D-type transistor 4-A5 to the gate of an E-type transistor 4-A21 in the second stage E/D circuit 4-A2. The transistor 4-A21 has one end grounded and the other end connected through a D-type transistor 4-A22 to one end of the transistor 2-2A. The output of the second stage E/D circuit 4-A2 is derived from the juncture between the transistors 4-A21 and 4-A22 and coupled to the gate of an E-type transistor 4-A31 in the third stage E/D circuit 4-A3. The transistor 4-A31 has one end grounded and the other end connected through a D-type transistor 4-A32 to the aforementioned one end of the transistor 2-2A. A capacitor 4-A6 for determining the oscillation frequency of the oscillator 4-A is connected between the gate of the transistor 4-A11 in the first E/D circuit 4-A1 and ground.

With the transistor 2-2A being "on" with the chip enable signal $\overline{CE}$ at a high level (5 volts), the power supply voltage $V_{DD}$ is applied to the oscillator 4-A of the above construction, and an oscillator output at a comparatively high frequency, for instance 10 MHz, is provided from the oscillator 4-A. This oscillator output is amplified by a following stage amplifier 4-B, which is constituted by a series combination of an E-type transistor 4-B1 and a D-type transistor 4-B2. To the gate of the transistor 4-B1 is coupled an output signal from the juncture between the transistors 4-A21 and 4-A22 in the second stage E/D circuit 4-A2. The transistor 4-B1 has one end grounded and the other end connected through the other transistor 4-B2 to the aforementioned one end of the transistor 2-2A.

To the gate of the transistor 4-B2 is coupled the oscillator output from the juncture between the transistors 4-A31 and 4-A32 in the last E/D circuit 4-A3.

The amplified oscillator output from the amplifier 4-B is derived from the juncture between the transistors 4-B1 and 4-B2 and coupled to one end of a coupling capacitor 4-C1 in a following single-stage charge pump circuit 4-C. The other end of the coupling capacitor 4-C3 is commonly connected to one end of two source-gate connected E-type transistors 4-C2 and 4-C3. The other end of the transistor 4-C2 is grounded, and the other end of the transistor 4-C3 is connected to an output terminal 2-5, from which the bias voltage $V_B$ is provided.

Thus, this self-sub-bias generator circuit 2-2 provides the output $V_B$ at 10 MHz only when the chip enable signal $\overline{CE}$ of "1" (5 volts) is supplied to the input terminal 2-1. The output $V_B$ is adapted to be about $-2.5$ volts under the conditions that the power supply voltage $V_{DD}$ is 5 volts and the threshold voltage $V_{TH}$ of each of the E-type transistors 4-C2 and 4-C3 is 0.5 volt.

Now, the detailed construction and operation of the self-sub-bias generator 2-4 which is rendered operative for the standby mode will be described with reference to FIG. 5. In FIGS. 2 and 5, like parts are designated by like reference symbols. The self-sub-bias generator 2-4 includes an oscillator 5-A, an amplifier 5-B and a three-stage charge pump circuit 5-C. Of these component parts, the oscillator 5-A and amplifier 5-B have similar construction as the respective oscillator 4-A and amplifier 4-B shown in FIG. 4, so their detailed description is omitted. It is the only exception that the gate of the transistor 2-4A for applying the supply voltage $V_B$ to the oscillator 5-A and 5-B is connected to the output terminal of the inverter 2-3 shown in FIG. 2, and that the capacitance of the capacitor 5-A6 is determined to be obtained 1 MHz output from the oscillator 5-A.

The oscillator output derived from the juncture between the transistors 5-B1 and 5-B2 of the amplifier 5-B is commonly coupled to one end of three capacitors 5-C1, 5-C2 and 5-C3 in the three-stage charge pump circuit 5-C. The other end of the capacitor 5-C3 is commonly connected to one end of E-type transistors 5-C4 and 5-C5, and the other end of the transistor 5-C5 is commonly connected to capacitors 5-C6 and 5-C7 and to one end of an E-type transistor 5-C8.

The other end of the capacitor 5-C2 is commonly connected to the other end of the E-type transistor 5-C8 and to one end of an E-type transistor 5-C9. The other end of the transistor 5-C9 is commonly connected to the other end of the capacitor 5-C7 and to one end of an E-type transistor 5-C1. The other end of the transistor 5-C10 is commonly connected to one end of an E-type transistor 5-C11 and to the other end of the capacitor 5-C1. The other end of the transistor 5-C11 is connected to the output terminal 2-5, from which the bias voltage $V_B$ is provided. In this way, a three-stage charge pump circuit is constructed. Thus, the voltage level of the oscillator output, for instance at 1 MHz, is lowered forward the negative level by the charge pump circuit 5-C, and a voltage of $-6$ volts is provided as the back bias voltage $V_B$ from the output terminal 2-5.

As has been shown, according to the invention the self-sub-bias is changed for the active and standby modes, so that the leakage current in the standby mode can be reduced to a level substantially comparable to that in the CMOS circuit without sacrifice of the characteristics in the active mode. In another aspect, in the active mode the amplitude of the signal current is large, and it is necessary to provide comparatively large charge pump capacity of the self-sub-bias generator in order to maintain a sufficient self-sub-bias. On the other hand, in the standby mode sufficient self-sub-bias can be maintained with a small charge pump capacity, and thus the power consumption of the self-sub-bias generator in this mode can be reduced. For example, the bias voltage frequency in the standby mode can be reduced to 1/10 to 1/100 of the bias voltage frequency in the active mode.

In the MOS inverter shown in FIG. 3, the source-gate connected D-type transistor T5 is used as load. Thus, as the operation mode is switched from the active mode over to the standby mode and vice versa, the bias voltage supplied to the bias input terminal 3-2 is switched from $-2.5$ volts to $-6$ volts and vice versa. Therefore, with a change of the back bias voltage the current supply capacity of the D-type transistor T5 is changed to change the power-delay product. To cope with this, as the load of the inverter a resistor may be used, which is a load element having a constant current supply capacity irrespective of the changes of the back bias voltage.

Figure 6:
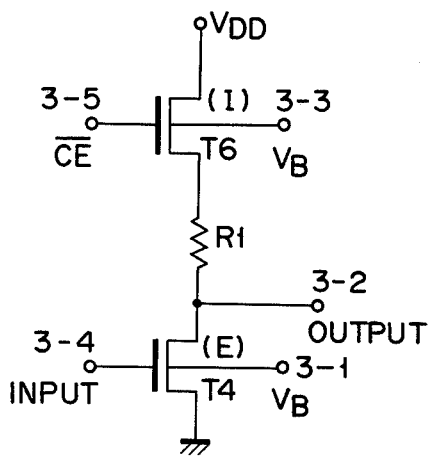
FIG. 6 is a circuit diagram showing a different MOS inverter.

FIG. 6 shows an example of such an inverter. In FIGS. 3 and 6, like parts are designated by like reference symbols. This inverter is the same as the inverter of FIG. 3 except for that a resistor R1 is used in lieu of the D-type transistor T5 between the transistors T4 and T6. In this construction, in the standby mode the transistor T6 operates as an E-type transistor and the current path of the transistor T6 is substantially completely cut off to provide practically no current to the load resistor R1, and thus the power consumption in the standby mode can be extremely reduced and the power-delay product can be maintained in a stable manner.

Figure 7:
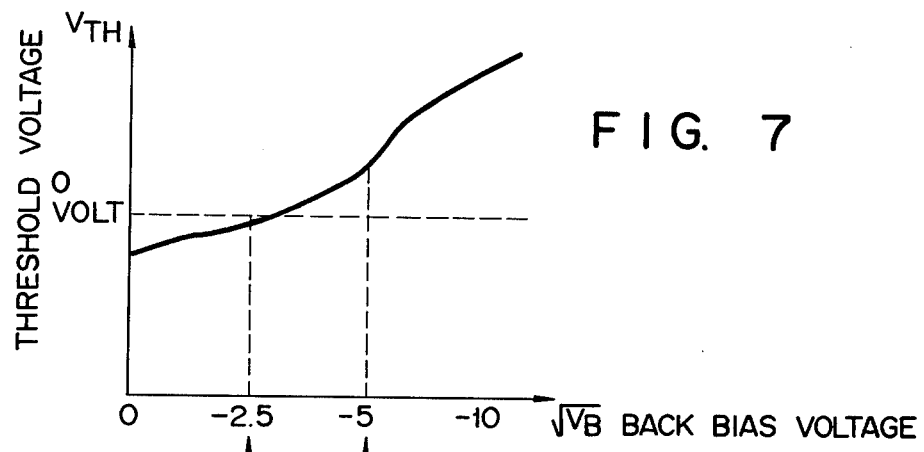
FIG. 7 is a graph showing the relation between the threshold voltage $V_{TH}$ of the mode switching transistor T6 and back bias voltage.

As has been mentioned previously, it is desirable that the mode switching transistor T6 shown in FIG. 6 acts as an I-type or D-type transistor in the active mode and as a perfect E-type transistor in the standby mode. To this end, the transistor T6 desirably has a threshold voltage $V_{TH}$ versus back bias voltage characteristic as shown in FIG. 7. In FIG. 7, the abscissa shows a $\sqrt{V_B}$ scale. In the characteristic of FIG. 7, when the back bias voltage $V_B$ becomes lower than $-5$ volts, the rate of increase of the threshold voltage is suddenly increases, so that the transistor T6 shows a strong E-type characteristic. On the other hand, when the back bias voltage is in the neighborhood of $-2.5$ volts, the threshold voltage is of course substantially 0 volt so that the transistor T6 shows an I-type characteristic.

Figure 8:
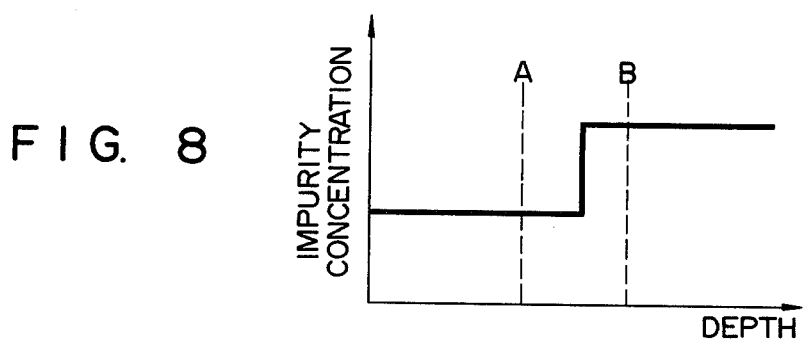
FIG. 8 is a graph showing the relation between the impurity concentration of a portion of the semiconductor substrate on which a mode switching transistor is formed and the depth from the substrate surface given in terms of the depletion layer varying according to the back bias voltage.

One way of imparting the transistor T6 with the characteristic as shown in FIG. 7 is to adjust the impurity concentration with respect to the depth from the semiconductor substrate surface. As shown in FIG. 8, the depletion layer that extends from the gate of the MOS transistor T6 in the thickness direction of the semiconductor substrate expands with the increase of the back bias. Dashed line A shows the position of the bottom of the depletion layer corresponding to $V_B = -2.5$ volts, and dashed line B shows the position of the bottom of the depletion layer corresponding to $V_B = -5$ volts. This means that the impurity concentration is desirably higher at the time of the application of the back bias voltage of $V_B = -5$ volts than at the time of $V_B = -2.5$ volts, so that the transistor acts as a complete E-type transistor in the standby mode.

Figure 9:
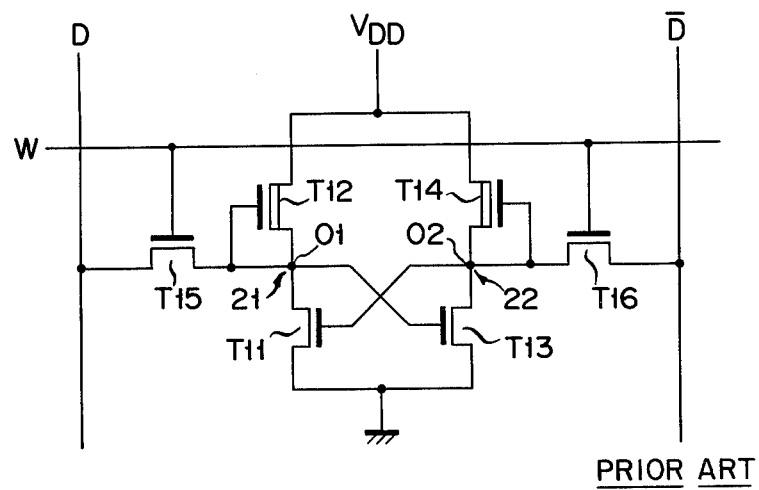
FIG. 9 is a circuit diagram showing a memory cell section of a static memory.

The MOS inverter shown in FIG. 3 may be used, for instance, as a peripheral circuit for a static memory in a semiconductor integrated circuit. FIG. 9 shows a memory cell section of such a memory. It includes a MOS inverter 21 having an E-type driver MOS transistor T11 and a D-type load MOS transistor T12 and a MOS inverter 22 likewise having an E-type driver MOS transistor T13 and a D-type load MOS transistor T14. The gate electrodes of the transistors T11 and T13 in the respective inverters 21 and 22 are respectively connected to the output terminals 02 and 01 of the opposite inverters. A transfer element T15 is provided between the output terminal 01 and a data line D, and a transfer element T16 is provided between the output terminal 02 and a data line $\overline{D}$. The transistors T15 and T16 have their gates connected to and driven by a word line W. The transistors T12 and T14 each have one end commonly connected to a power supply terminal $V_{DD}$, and the transistors T11 and T13 each have one end grounded.

With the memory cell of this construction, when the peripheral circuit formed on the same semiconductor substrate is switched to the standby mode so that $V_B$ is changed from $-2.5$ volts to $-6$ volts, the threshold voltage $V_{TH}$ of each transistors is increased as is seen from FIG. 7. In consequence, the current through the load MOS transistors T12 and T14 in the memory cell is reduced, so that the cell becomes readily susceptible to power supply voltage fluctuations, temperature changes and influence of $\alpha$-rays, and the operation becomes instable. To cope with this, a resistor may be used as the load as has been described earlier in connection with FIG. 6.

Figure 10:
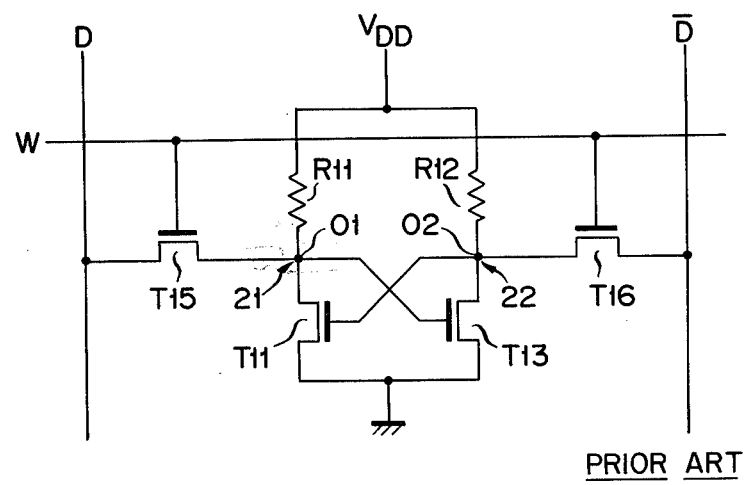
FIG. 10 is a circuit diagram showing a memory cell constructed by using the MOS inverter shown in FIG. 6.

FIG. 10 shows an example of such a memory cell. In FIGS. 9 and 10, like parts are designated by like reference numerals. In this example, load resistors R11 and R12 are connected between the respective nodes 01 and 02 on one hand and the power supply terminal $V_{DD}$ on the other hand in lieu of the load MOS transistors T12 and T14 in FIG. 9. The rest of the construction is the same as in the memory cell of FIG. 9.

With the construction of FIG. 10, the bias can be changed from $-2.5$ volts to $-6$ volts in the standby mode. Even when the absolute value of the back bias voltage is thus increased, the load of the memory cell, which is constituted by the load resistors R11 and R12, is free from the influence of the back bias voltage change, that is, the same current as before flows through the resistors R11 and R12. Thus, a static memory cell which is hardly susceptible to the power supply voltage fluctuations, temperature changes and influence of α-rays can be obtained.

What is claimed is:

1. A semiconductor integrated circuit device comprising:
    a semiconductor logic circuit operable both in active and standby modes; and
    on-chip substrate bias generating means, including an input terminal responsive to a mode control signal having first and second signal levels respectively corresponding to said active and standby modes, for providing a first on-chip substrate bias voltage to said semiconductor logic circuit in said active mode in response to said first signal level and a second on-chip substrate bias voltage of a different value in said standby mode in response to said second signal level, thereby reducing the power consumption of both said logic circuit and said substrate bias generating means during said standby mode.

2. A semiconductor integrated circuit device comprising:
    a semiconductor logic circuit operable both in active and standby modes; and
    on-chip substrate bias generating means for providing a first on-chip substrate bias voltage to said semiconductor logic circuit in said active mode and a second on-chip bias voltage of a different value in said standby mode, wherein said on-chip substrate bias generating means includes a first generator for generating said first on-chip substrate bias voltage at the time of said active mode and a second generator for generating said second on-chip substrate bias voltage at the time of said standby mode.

3. A semiconductor integrated circuit device comprising:
    a semiconductor logic circuit operable both in active and standby modes, wherein said semiconductor logic circuit is a MOS inverter including a mode switching transistor having a gate for receiving a chip enable signal and a drain-source current path connected between a power supply terminal and a node, a load element connected between said node and an output terminal, and a transistor having a gate receiving an input signal and a drain-source current path connected between said output terminal and ground; and
    on-chip substrate bias generating means for providing a first on-chip substrate bias voltage to said semiconductor logic circuit in said active mode and a second on-chip substrate bias voltage of a different value in said standby mode.

4. A semiconductor integrated circuit device according to claim 1, wherein said on-chip substrate bias generating means includes a first generator for generating a first on-chip substrate bias voltage at the time of said active mode and a second generator for generating a second on-chip substrate bias voltage at the time of said standby mode.

5. A semiconductor integrated circuit device according to claim 1, wherein said semiconductor logic circuit is a MOS inverter including a mode switching transistor having a gate for receiving a chip enable signal and a drain-source current path connected between a power supply terminal and a node, a load element connected between said node and an output terminal, and a transistor having a gate receiving an input signal and a drain-source current path connected between said output terminal and ground.

6. A semiconductor integrated circuit device according to claim 3 or 5, wherein said load element is a load MOS transistor.

7. A semiconductor integrated circuit device according to claim 3 or 5, wherein said load element is a resistor.

8. A semiconductor integrated circuit device according to claim 2 or 4, wherein the frequency of said second on-chip substrate bias voltage generated from said second generator is set to a value within a range of 1/10 to 1/100 of the frequency of the first on-chip substrate bias voltage generated from said first generator.

9. A semiconductor integrated circuit device according to claim 1 or 2, wherein said first generator includes an oscillator, an amplifier for amplifying the output of said oscillator and a charge pump circuit having a construction consisting of at least one stage for imparting the output of said amplifier with a predetermined level.

10. A semiconductor integrated circuit device according to claim 2 or 4, wherein said second generator includes an oscillator, an amplifier for amplifying the output of said oscillator circuit, and a charge pump circuit having a construction consisting of a plurality of stages for increasing the bias voltage level of the output signal from said amplifier.

11. A semiconductor integrated circuit device according to claim 3 or 5, wherein said mode switching transistor functions as a weak depletion or depletion type MOS transistor for causing sufficient current with a first back gate bias given in said active mode and functions as an enhancement-type MOS transistor for substantially cutting off current with a second back gate bias given in said standby mode.

12. A semiconductor integrated circuit device according to claim 3 or 5, wherein the threshold voltage of said mode switching transistor is substantially zero volt determined by the substrate bias voltage in the active mode and sharply increases with a voltage less than the substrate bias that is given in the standby mode.

13. A semiconductor integrated circuit device according to claim 12, wherein the impurity concentration of the portion of the semiconductor substrate on which said mode switching transistor is made sharply increases at a depth intermediate between the bottom of a depletion layer formed with the first on-chip substrate bias given in the active mode and the bottom of a depletion layer formed with the second on-chip substrate bias given in the standby mode.

14. A semiconductor integrated circuit device comprising an integrated circuit including first and second MOS inverters each including a load resistor provided between a first voltage supply terminal and an output terminal and a drive element having its drain-source current path connected between a second voltage supply terminal and said output terminal, the output terminal of said first MOS inverter being connected to the gate electrode of the drive element in said second MOS inverter, the output terminal of said second MOS inverter being connected to the gate electrode of the drive element in said first MOS inverter, a transfer element being connected to the output terminal of each of said first and second MOS inverters for transferring an output signal therefrom, and bias voltage generating means for generating a first on-chip substrate bias voltage with respect to the semiconductor substrate of said integrated circuit in a first mode and a second on-chip substrate bias voltage in a second mode, whereby the current level in each of said load resistors is substantially unaffected by the on-chip substrate bias changing between said first voltage and said second voltage.

* * * * *